United States Patent
Hera et al.

(10) Patent No.: US 9,838,786 B2
(45) Date of Patent: *Dec. 5, 2017

(54) DYNAMIC ENGINE HARMONIC ENHANCEMENT SOUND STAGE

(71) Applicant: Bose Corporation, Framingham, MA (US)

(72) Inventors: Cristian M. Hera, Framingham, MA (US); Donald J. MacLellan, Hudson, MA (US); Ben J. Feng, Sudbury, MA (US)

(73) Assignee: Bose Corporation, Framingham, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/290,370

(22) Filed: Oct. 11, 2016

(65) Prior Publication Data

US 2017/0034622 A1    Feb. 2, 2017

Related U.S. Application Data

(63) Continuation of application No. 14/300,940, filed on Jun. 10, 2014, now Pat. No. 9,495,953.

(51) Int. Cl.
*H04S 7/00*    (2006.01)
*H04R 3/04*    (2006.01)
(Continued)

(52) U.S. Cl.
CPC .............. *H04R 3/04* (2013.01); *G10K 15/02* (2013.01); *H03G 9/005* (2013.01); *H04R 1/22* (2013.01);
(Continued)

(58) Field of Classification Search
CPC ... H04R 3/04; H04R 3/00; H04R 3/12; H04R 1/22; H04R 2499/13; G10K 15/02; H03G 9/005; H03G 5/00
(Continued)

(56) References Cited

U.S. PATENT DOCUMENTS 9,495,953 B2 * 11/2016 Hera ................. H04R 1/22
2007/0223728 A1   9/2007 Sakamoto et al.
(Continued)

FOREIGN PATENT DOCUMENTS

DE    19746523 A1    5/1998
FR    2974441 A1    10/2012
FR    2974442 A1    10/2012

OTHER PUBLICATIONS

International Search Report and Written Opinion dated Oct. 6, 2015 for PCT/US2015/033113.

*Primary Examiner* — Md S Elahee
*Assistant Examiner* — Sabrina Diaz
(74) *Attorney, Agent, or Firm* — Bose Corporation

(57) ABSTRACT

A method to produce a dynamic sound stage for engine harmonic enhancement (EHE). Dynamic refers to the ability to position the sound stage at different positions as the engine operates at various RPMs and load. In order to control the sound stage width, a phase difference can be introduced between a first audio channel (e.g., a left audio channel) and second audio channel (e.g., a right audio channel). In the most general case, the phase difference can be introduced per harmonic per RPM. In this approach, the phase difference can be adjusted such that a vehicle occupant will perceive each harmonic signal to have a particular width. This width can be adjusted independently per RPM regions by tuning the per harmonic phase difference.

14 Claims, 13 Drawing Sheets

(51) Int. Cl.
  *H04R 1/22* (2006.01)
  *G10K 15/02* (2006.01)
  *H04R 3/00* (2006.01)
  *H03G 9/00* (2006.01)
  *H04R 3/12* (2006.01)
  *H03G 5/00* (2006.01)

(52) U.S. Cl.
  CPC ............... *H04R 3/00* (2013.01); *H04R 3/12* (2013.01); *H03G 5/00* (2013.01); *H04R 2499/13* (2013.01)

(58) Field of Classification Search
  USPC .......................................................... 381/86
  See application file for complete search history.

(56) References Cited

U.S. PATENT DOCUMENTS

| | | | |
|---|---|---|---|
| 2011/0216916 A1* | 9/2011 | Hera | G10K 15/02 381/86 |
| 2012/0177214 A1 | 7/2012 | Hera et al. | |
| 2013/0156213 A1 | 6/2013 | Pan et al. | |
| 2014/0016792 A1 | 1/2014 | Christoph | |

\* cited by examiner

DYNAMIC ENGINE HARMONIC ENHANCEMENT SOUND STAGE

CROSS-REFERENCE TO RELATED APPLICATIONS

This application is a continuation of U.S. application Ser. No. 14/300,940, filed Jun. 10, 2014, which is incorporated herein by reference in its entirety.

BACKGROUND

This document describes a method to produce a dynamic sound stage for engine harmonic enhancement (EHE). Dynamic refers to the ability to position the sound stage at different positions as the engine operates at various RPMs and load.

Engine harmonic enhancement (EHE) is used to create a set of harmonic signals to complement or mask certain characteristics of an engine sound. Each harmonic signal generated in EHE, has a magnitude, $c_k(t)$, and phase, $\phi_k(t)$, that varies in time:

$$k_k(t) = c_k(t) \cdot \sin(\omega_k(t) \cdot t + \omega_k(t)) \qquad (1)$$

where $$\omega_k = 2\pi f_k = 2\pi l_k f_1 = 2\pi l_k \frac{RPM}{60},$$

and $f_1$ is the fundamental frequency of the engine, $l_k$ is the harmonic order that usually is a multiple of 0.5, but in general, from an algorithm capability, can be a positive non-zero real number. RPM is the engine speed, and $f_k$ is the frequency, in Hz, of harmonic k.

$$h_k(t) = c_k(\text{rpm}(t)) \cdot \sin(\omega_k(\text{rpm}(t)) \cdot t + \omega_k(\text{rpm}(t))) \qquad (2)$$

The signal generated in EHE is a function of time, RPM, engine load, and can be written as the sum of all contributing harmonics:

$$x(\text{rpm}, t) = \Sigma_{k=1}^{N} c_k(\text{rpm}) \cdot \sin(\omega_k(\text{rpm}) \cdot t + \omega_k(\text{rpm})) \qquad (3)$$

where N is a total number of harmonics considered.

SUMMARY

This disclosure is based, in part, on the realization that an engine harmonic enhancement (EHE) sound stage can be controlled in width by introducing a per harmonic phase difference between left and right channel EHE signals. This disclosure is also based, in part, on the realization that a front-rear controllable EHE sound stage can be provided by introducing a magnitude difference between a front channel EHE signal for front loudspeakers and a rear channel EHE signal to be played via rear loudspeakers. All examples and features mentioned below can be combined in any technically possible way.

One aspect features a method that includes providing a fundamental frequency corresponding to the RPM of an engine of a vehicle; determining a plurality of harmonics of the fundamental frequency; and determining a plurality of first gain values. The plurality of first gain values includes, for each harmonic of the plurality of harmonics, a first gain value as a function of RPM. The method also includes determining a plurality of first phase values. The plurality of first phase values includes, for each harmonic of the plurality of harmonics, a first phase value as a function of RPM. The plurality of harmonics, the plurality of first gain values, and the plurality of first phase values are combined to produce a first set of harmonic enhancement signals, and the harmonic enhancement signals of the first set are combined to provide a first channel harmonic enhancement signal.

The method also includes determining a plurality of second gain values and a plurality of second phase values. The plurality of second gain values includes, for each harmonic of the plurality of harmonics, a second gain value as a function of RPM. The plurality of second phase values includes, for each harmonic of the plurality of harmonics, a second phase value as a function of RPM. The plurality of harmonics, the plurality of second gain values, and the plurality of second phase values are combined to produce a second set of harmonic enhancement signals, and the harmonic enhancement signals of the second set are combined to provide a second channel harmonic enhancement signal. A per harmonic phase difference between the plurality of first phase values and the plurality of second phase values varies as a function of the engine RPM.

Implementations may include one of the following features, or any combination thereof.

In some implementations, the per harmonic phase difference between the plurality of first phase values and the plurality of second phase values varies as a function of engine load.

In certain implementations, a per harmonic gain difference between the plurality of first gain values and the plurality of second gain values varies as a function of the engine RPM.

In some cases, the first channel harmonic enhancement signal is a front channel signal and the second channel harmonic enhancement signal is a rear channel signal.

In certain cases, the first channel harmonic enhancement signal is a left channel signal and the second channel harmonic enhancement signal is a right channel signal.

In some examples, the method includes distributing the first channel harmonic enhancement signal to one or more first speakers for transduction to acoustic energy; and distributing the second channel harmonic enhancement signal to one or more second speakers for transduction to acoustic energy, In certain examples, the one or more first speakers are positioned near a left side of a vehicle cabin of the vehicle and the one or more second speakers are positioned near a right side of the vehicle.

In some implementations, distributing the first channel harmonic enhancement signal to one or more first speakers includes equalizing the first channel harmonic enhancement signal separately for each of the one or more first speakers to provide individually equalized first channel harmonic enhancement signals to the one or more first speakers. Distributing the first channel harmonic enhancement signal can also include passing the equalized first channel harmonic enhancement signals through an amplifier before they are provided to the one or more first speakers.

In certain implementations, distributing the second channel harmonic enhancement signal to one or more second speakers includes equalizing the second channel harmonic enhancement signal separately for each of the one or more second speakers to provide individually equalized second channel harmonic enhancement signals to the one or more second speakers. Distributing the second channel harmonic enhancement signal can also include passing the equalized second channel harmonic enhancement signals through an amplifier before they are provided to the one or more second speakers.

In some implementations, the one or more first speakers are positioned near a front portion of a vehicle cabin and the one or more second speakers are positioned near a rear portion of the vehicle cabin.

In certain implementations, the method includes determining a plurality of third gain values and a plurality of fourth gain values. The plurality of third gain values includes, for each harmonic of the plurality of harmonics, a third gain value as a function of engine load. The plurality of fourth gain values includes, for each harmonic of the plurality of harmonics, a fourth gain value as a function of engine load. The plurality of harmonics, the plurality of first gain values, the plurality of third gain values, and the plurality of first phase values are combined to produce the first set of harmonic enhancement signals. Additionally, the plurality of harmonics, the plurality of second gain values, the plurality of fourth gain values, and the plurality of second phase values are combined to produce the second set of harmonic enhancement signals.

Another aspect features a method that includes providing a fundamental frequency corresponding to the RPM of an engine of a vehicle; determining a plurality of harmonics of the fundamental frequency; and determining a plurality of first gain values. The plurality of first gain values includes, for each harmonic of the plurality of harmonics, a first gain value as a function of RPM. The method also includes determining a plurality of first phase values. The plurality of first phase values includes, for each harmonic of the plurality of harmonics, a first phase value as a function of RPM. The plurality of harmonics, the plurality of first gain values, and the plurality of first phase values are combined to produce a first set of harmonic enhancement signals, and the harmonic enhancement signals of the first set are combined to provide a first channel harmonic enhancement signal.

The method also includes determining a plurality of second gain values and a plurality of second phase values. The plurality of second gain values includes, for each harmonic of the plurality of harmonics, a second gain value as a function of RPM. The plurality of second phase values includes, for each harmonic of the plurality of harmonics, a second phase value as a function of RPM. The plurality of harmonics, the plurality of second gain values, and the plurality of second phase values are combined to produce a second set of harmonic enhancement signals, and the harmonic enhancement signals of the second set are combined to provide a second channel harmonic enhancement signal. A per harmonic gain difference between the plurality of first gain values and the plurality of second gain values varies as a function of the engine RPM.

Implementations may include one of the above and/or below features, or any combination thereof.

In some implementations, the per harmonic gain difference between the plurality of first phase values and the plurality of second phase values varies as a function of engine load.

In certain implementations, the first channel harmonic enhancement signal is a front channel signal and the second channel harmonic enhancement signal is a rear channel signal.

In some cases, the method includes distributing the first channel harmonic enhancement signal to one or more first speakers for transduction to acoustic energy; and distributing the second channel harmonic enhancement signal to one or more second speakers for transduction to acoustic energy. The one or more first speakers are positioned near a front portion of a vehicle cabin and the one or more second speakers are positioned near a rear portion of the vehicle cabin.

In some cases, distributing the first channel harmonic enhancement signal to one or more first speakers includes equalizing the first channel harmonic enhancement signal separately for each of the one or more first speakers to provide individually equalized first channel harmonic enhancement signals to the one or more first speakers. Distributing the first channel harmonic enhancement signal can also include passing the equalized first channel harmonic enhancement signals through an amplifier before they are provided to the one or more first speakers.

In certain cases, distributing the second channel harmonic enhancement signal to one or more second speakers includes equalizing the second channel harmonic enhancement signal separately for each of the one or more second speakers to provide individually equalized second channel harmonic enhancement signals to the one or more second speakers. Distributing the second channel harmonic enhancement signal can also include passing the equalized second channel harmonic enhancement signals through an amplifier before they are provided to the one or more second speakers.

Yet another aspect features a method that includes generating a first channel harmonic enhancement signal that includes a first plurality of engine harmonic enhancement signal components; and generating a second channel harmonic enhancement signal that includes a second plurality of engine harmonic enhancement signal components. The first channel harmonic enhancement signal is distributed to one or more first speakers for transduction to acoustic energy, and the second channel harmonic enhancement signal is distributed to one or more second speakers for transduction to acoustic energy. A per harmonic phase difference is introduced between the first channel harmonic enhancement signal and the second channel harmonic enhancement signal.

Implementations may include one of the above and/or below features, or any combination thereof.

In some implementations, the per harmonic phase difference varies as a function of engine RPM.

In certain implementations, the per harmonic phase difference varies as a function of engine load.

In some cases, the first channel harmonic enhancement signal is a left channel signal and the second channel harmonic enhancement signal is a right channel signal.

In certain cases, the one or more first speakers are positioned near a left side of a vehicle cabin and the one or more second speakers are positioned near a right side of the vehicle cabin.

Another aspect features a method that includes generating a first channel harmonic enhancement signal that includes a first plurality of engine harmonic enhancement signal components; and generating a second channel harmonic enhancement signal that includes a second plurality of engine harmonic enhancement signal components. The first channel harmonic enhancement signal is distributed to one or more first speakers for transduction to acoustic energy, and the second channel harmonic enhancement signal is distributed to one or more second speakers for transduction to acoustic energy. A per harmonic magnitude difference is introduced between the first channel harmonic enhancement signal and the second channel harmonic enhancement signal.

Implementations may include one of the above and/or below features, or any combination thereof.

In some implementations, the per harmonic magnitude difference varies as a function of engine RPM.

In certain implementations, the per harmonic magnitude difference varies as a function of engine load.

In some cases, the first channel harmonic enhancement signal is a front channel signal and the second channel harmonic enhancement signal is a rear channel signal.

In certain cases, the one or more first speakers are positioned near a front portion of a vehicle cabin and the one or more second speakers are positioned near a rear portion of the vehicle.

In some examples, distributing the first channel harmonic enhancement signal to one or more first speakers includes equalizing the first channel harmonic enhancement signal separately for each of the one or more first speakers to provide individually equalized first channel harmonic enhancement signals to the one or more first speakers. Distributing the first channel harmonic enhancement signal can also include passing the equalized first channel harmonic enhancement signals through an amplifier before they are provided to the one or more first speakers.

In certain examples, distributing the second channel harmonic enhancement signal to one or more second speakers includes equalizing the second channel harmonic enhancement signal separately for each of the one or more second speakers to provide individually equalized second channel harmonic enhancement signals to the one or more second speakers. Distributing the second channel harmonic enhancement signal can also include passing the equalized second channel harmonic enhancement signals through an amplifier before they are provided to the one or more second speakers.

In some implementations, distributing the first channel harmonic enhancement signal to one or more first speakers includes passing the first channel harmonic enhancement signal through an amplifier before it is provided to the one or more first speakers, and distributing the second channel harmonic enhancement signal to one or more second speakers includes passing the second channel harmonic enhancement signal through the amplifier before it is provided to the one or more second speakers.

According to another aspect, a vehicle engine sound enhancement system includes circuitry for providing a fundamental frequency corresponding to the RPM of an engine of a vehicle; circuitry for determining a plurality of harmonics of the fundamental frequency; and circuitry for determining a plurality of first gain values. The plurality of first gain values includes, for each harmonic of the plurality of harmonics, a first gain value as a function of RPM. The vehicle engine sound enhancement system also includes circuitry for determining a plurality of first phase values. The plurality of first phase values includes, for each harmonic of the plurality of harmonics, a first phase value as a function of RPM. Circuitry is provided for combining the plurality of harmonics, the plurality of first gain values, and the plurality of first phase values to produce a first set of harmonic enhancement signals, and circuitry is provided for combining the harmonic enhancement signals of the first set to provide a first channel harmonic enhancement signal.

The vehicle engine sound enhancement system also includes circuitry for determining a plurality of second gain values, and circuitry for determining a plurality of second phase values. The plurality of second gain values includes, for each harmonic of the plurality of harmonics, a second gain value as a function of RPM. The plurality of second phase values includes, for each harmonic of the plurality of harmonics, a second phase value as a function of RPM. Circuitry is provided for combining the plurality of harmonics, the plurality of second gain values, and the plurality of second phase values to produce a second set of harmonic enhancement signals, and circuitry is provided for combining the harmonic enhancement signals of the second set to provide a second channel harmonic enhancement signal. A per harmonic phase difference between the plurality of first phase values and the plurality of second phase values varies as a function of the engine RPM.

DETAILED DESCRIPTION

Figure 1:
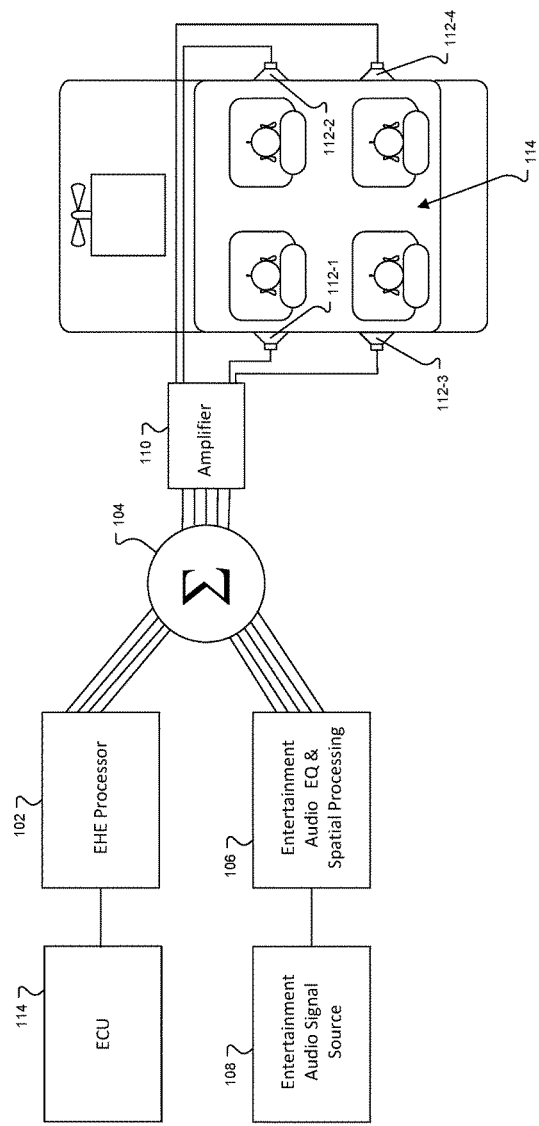
FIG. 1 is a block diagram of a vehicle including a vehicle engine sound enhancement system which can be utilized to provide a dynamic engine harmonic enhancement (EHE) sound stage.

Though the elements of several views of the drawing may be shown and described as discrete elements in a block diagram and may be referred to as "circuitry", unless otherwise indicated, the elements may be implemented as one of, or a combination of, analog circuitry, digital circuitry, or one or more microprocessors executing software instructions. The software instructions may include digital signal processing (DSP) instructions. Operations may be performed by analog circuitry or by a microprocessor executing software that performs the mathematical or logical equivalent to the analog operation. Unless otherwise indicated, signal lines may be implemented as discrete analog or digital signal lines, as a single discrete digital signal line with appropriate signal processing to process separate streams of audio signals, or as elements of a wireless communication system. Some of the processes may be described in block diagrams. The activities that are performed in each block may be performed by one element or by a plurality of elements, and may be separated in time. The elements that perform the activities of a block may be physically separated. One element may perform the activities of more than one block. Unless otherwise indicated, audio signals may be encoded and transmitted in either digital or analog form; conventional digital-to-analog or analog-to-digital converters may be omitted from the figures.

Creating a Controllable Width Sound Stage

To control the width of the sound stage a left channel EHE signal, $x_L$, for the left loudspeakers and a right channel EHE signal, $x_R$, for the right loudspeakers are generated as follows:

$$x_L(\text{rpm},t) = \sum_{k=1}^{N} c_{Lk}(\text{rpm}) \cdot \sin(\omega_k(\text{rpm}) \cdot t + \phi_{Lk}(\text{rpm})) \quad (4)$$

$$x_R(\text{rpm},t) = \sum_{k=1}^{N} c_{Rk}(\text{rpm}) \cdot \sin(\omega_k(\text{rpm}) \cdot t + \phi_{Rk}(\text{rpm})) \quad (5)$$

where $c_{Lk}$ and $\phi_{Lk}$ are the magnitude and the phase, respectively, of harmonic k in the left channel EHE signal, and $c_{Rk}$ and $\phi_{Rk}$ are the magnitude and the phase, respectively, of harmonic k in the right channel EHE signal.

In order to control the sound stage width, a phase difference, $\Delta\phi_k$, can be introduced between the left and right channel. In the most general case, the left-right phase difference can be introduced per harmonic per RPM. In this approach, the phase difference can be adjusted such that a vehicle occupant will perceive each harmonic signal to have a particular width. This width can be adjusted independently per RPM regions by tuning the variable $\Delta\phi_k(\text{rpm})$:

$$\Delta\phi_k(\text{rpm}) = \phi_{Lk}(\text{rpm}) - \phi_{Rk}(\text{rpm}) \quad (6)$$

Generally, the magnitudes of the left and right channel EHE signals will be the same (i.e., $c_{Lk}(\text{rpm}) = c_{Rk}(\text{rpm})$).

The sound stage is dynamic in that the width of the sound stage changes with the engine RPM.

FIG. 1 is a block diagram of a vehicle including a vehicle engine sound enhancement system which can be utilized to provide a dynamic engine harmonic enhancement (EHE) sound stage. An engine harmonic enhancement (EHE) processor 102 is coupled to a summer 104. Also coupled to the summer 104 by an entertainment audio equalizer and spatial processor 106 is an entertainment audio signal source 108. The summer 104 is coupled through a multi-channel amplifier 110 to a number of loudspeakers 112-1-112-4 positioned about the vehicle cabin 114. The couplings between the EHE processor 102, the summer 104, the entertainment audio equalizer and spatial processor 106, and the amplifier 110 are multichannel, as indicated by the multiple lines. As stated above, signal lines may be implemented as discrete analog or digital signal lines, as a single discrete digital signal line with appropriate signal processing to process separate streams of audio signals, or as elements of a wireless communication system.

In operation, the entertainment audio source 108 and entertainment audio equalizer and spatial processor 106 operate conventionally, to provide equalized and spatially processed audio entertainment to the occupants of the vehicle cabin 114. In some implementations, the entertainment audio signal source 108 can include announcement audio signals, for navigation, warning signals, and the like. The EHE processor 102 processes EHE audio signals so that, when reproduced by the loudspeakers 112-1-112-4 they provide a desired sonic experience. The EHE processor will generate signals for left and right audio channels, and/or front and hind (rear) audio channels, which will be passed through a static EQ (sound stage processor) which is similar to the entertainment audio EQ. The processed EHE audio signals and the processed entertainment audio signals are summed at summer 104, amplified by amplifier 110 and transduced to acoustic energy by the loudspeakers.

Figure 2A:
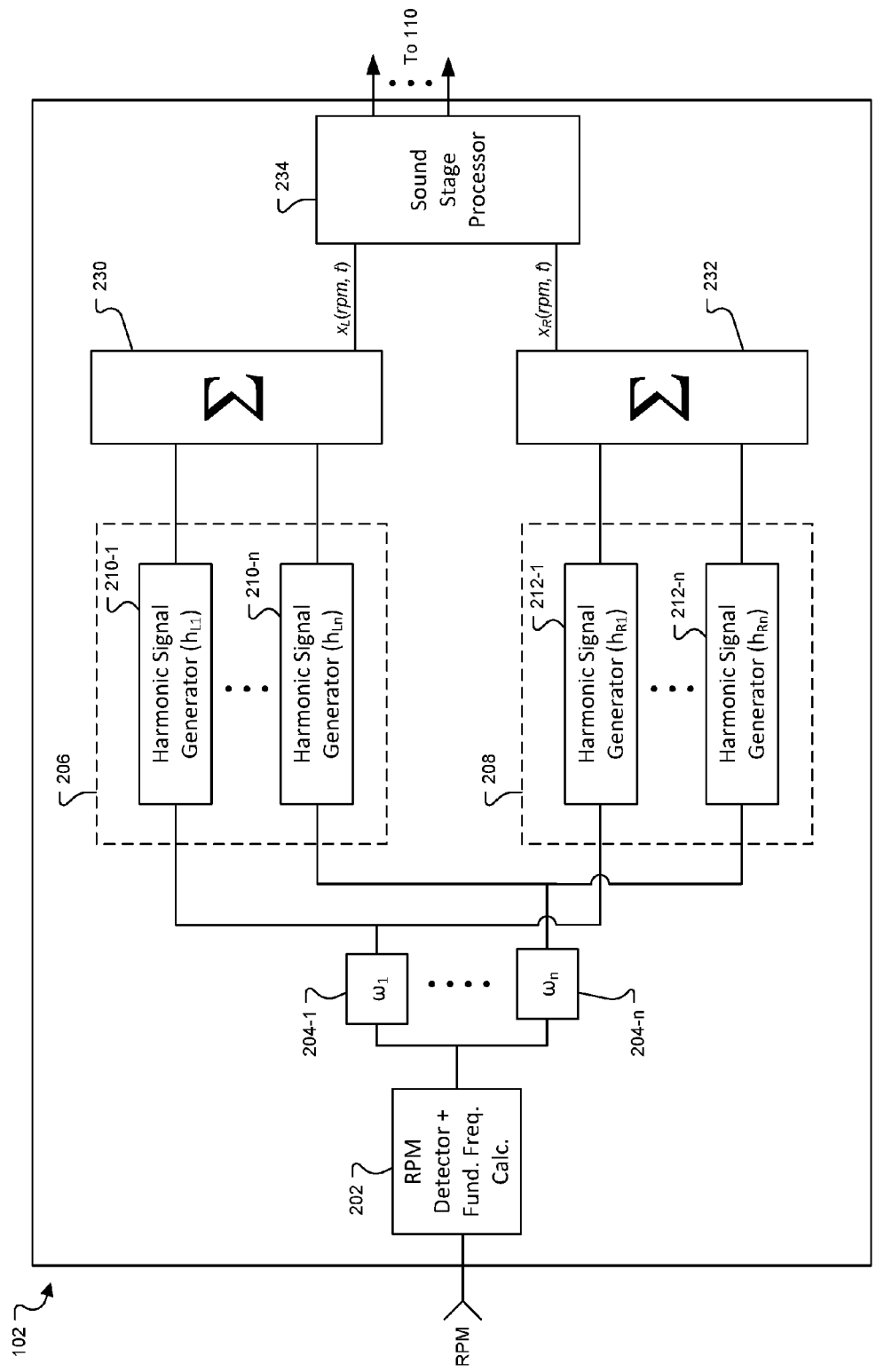
FIG. 2A is a block diagram of an EHE processor from the vehicle engine sound enhancement system of FIG. 1.
Figure 2B:
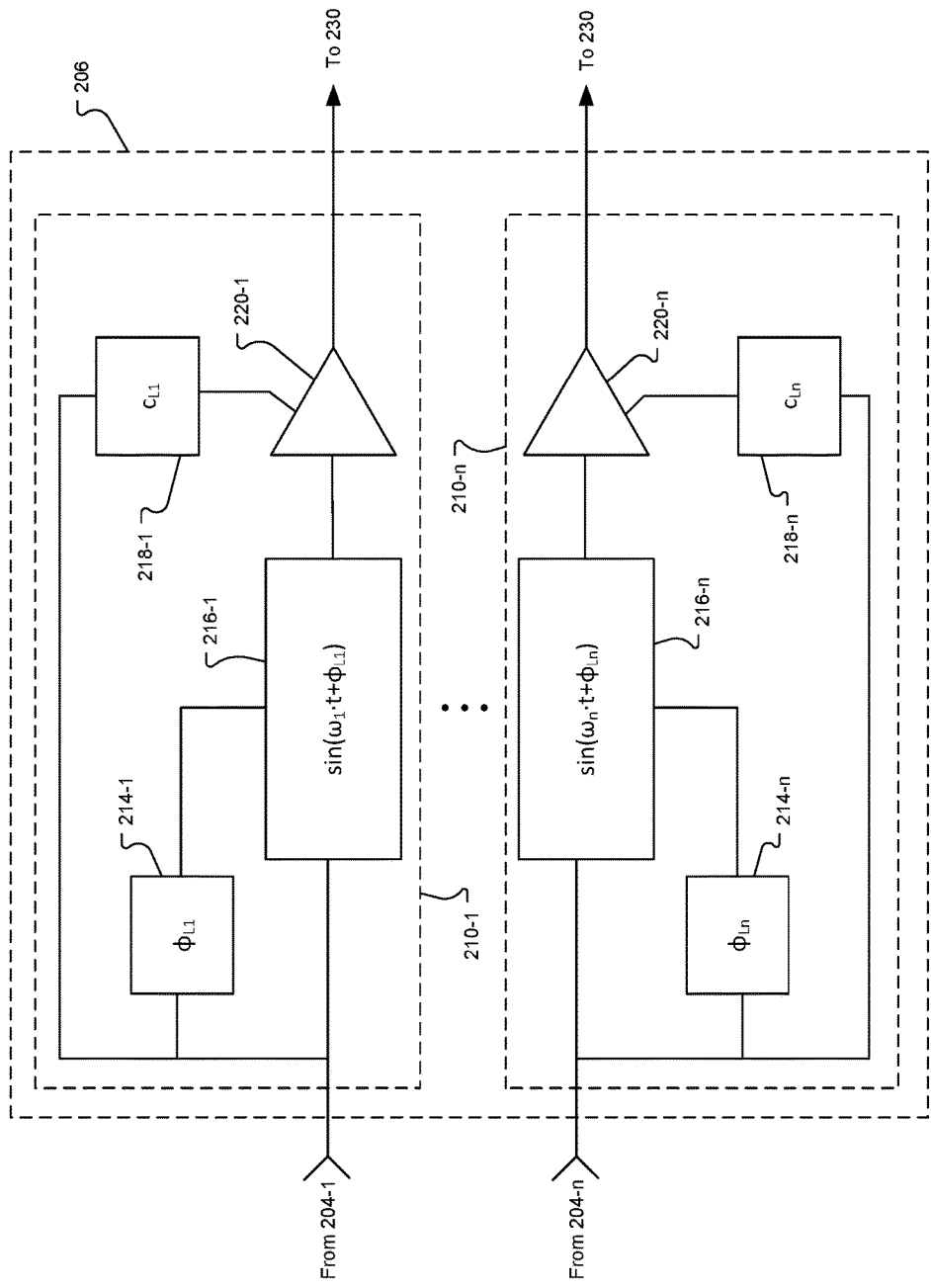
FIG. 2B is a block diagram of a left channel EHE signal generator from the EHE processor of FIG. 2A.
Figure 2C:
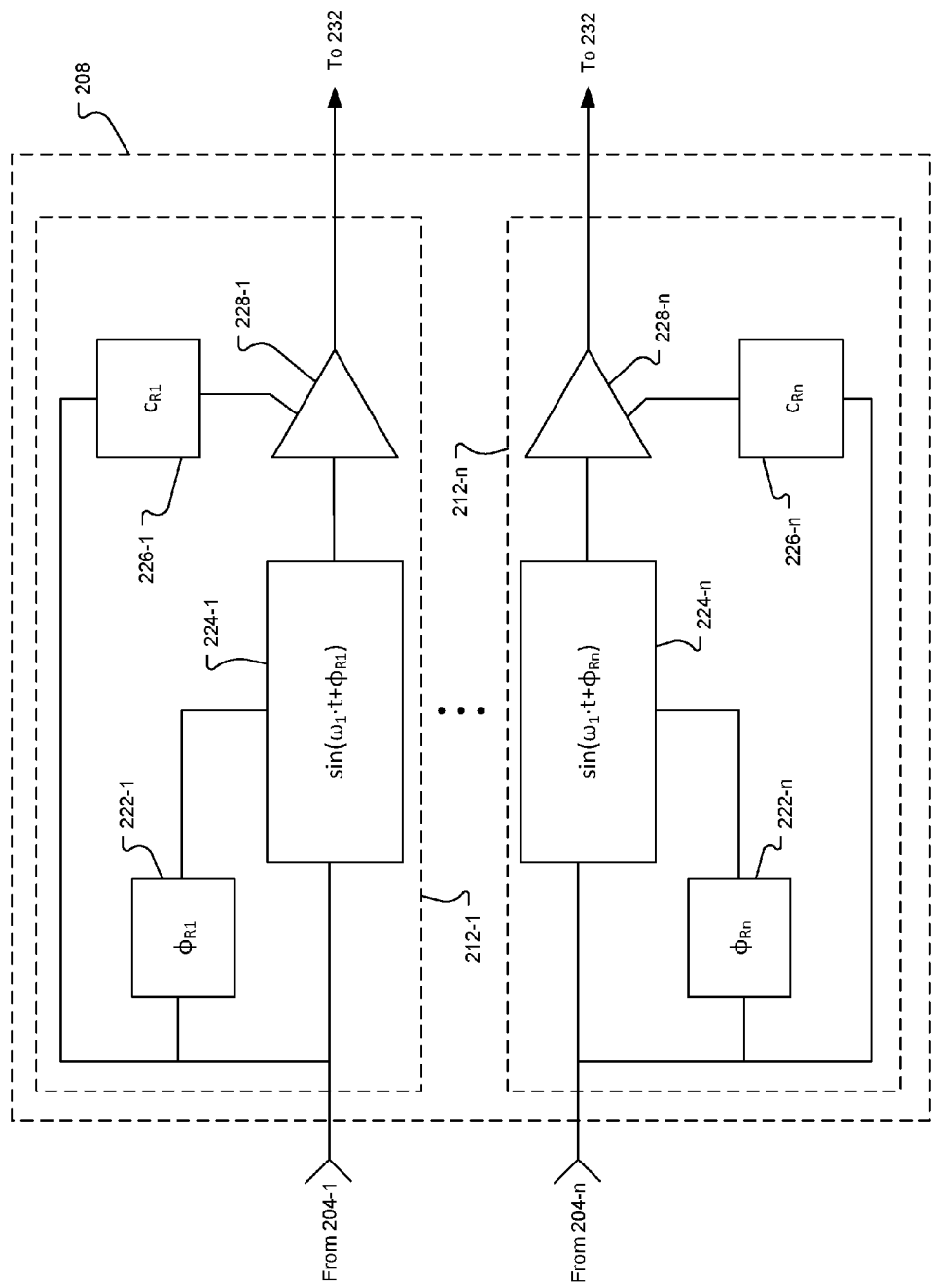
FIG. 2C is a block diagram of a right channel EHE signal generator from the EHE processor of FIG. 2A.

Referring to FIGS. 2A through 2C, the EHE processor 102 includes an RPM detector and fundamental frequency calculator 202 which receives as input a signal indicative of the engine speed in RPM. This signal may come from the vehicle's engine control unit (ECU) 114 (FIG. 1). The RPM detector and fundamental frequency calculator 202 is operationally coupled to a plurality of frequency converters 204-1-204-n (where n is the total number of harmonics considered) which generate respective harmonic signals each of which is a multiple of the fundamental frequency.

In operation, the RPM signal that is input to the RPM detector and fundamental frequency calculator 202 determines the fundamental frequency of the engine harmonics and the engine load signal controls the overall sound level of the harmonic enhancement. "Harmonics" as used herein can include half harmonics or quarter harmonics. The RPM signal can be an analog signal over a wire or a digital signal over a bus (GMLAN, CAN, MOST, etc.). In one implementation, the RPM signal indicates a known number of pulses per engine revolution. If the RPM signal comes from an ignition module, the number of pulses per revolution (PPR) is usually equal to the number of engine cylinders which fire each revolution or half of the total number of active engine cylinders since only half of a conventional (four-stroke) engine's cylinders fire each revolution. For example, an ignition-based RPM signal from an 8 cylinder engine will have 4 PPR. If the RPM comes from a crankshaft sensor the number of pulses is equal to the number of equally-spaced teeth on the crankshaft position wheel, not including special teeth used to indicate crank position, typically to indicate the top dead center (TDC) position of the crankshaft.

The RPM detector and fundamental harmonic frequency calculator 202 measures the time between successive RPM pulses, and computes the reciprocal to determine the fundamental engine harmonic frequency.

The frequency converters 204-1-204-n (referenced collectively as "204") compute the frequency for each enhanced harmonic by multiplying the fundamental engine rotation frequency by the order of each enhanced engine harmonic. The frequency converters 204 are operationally coupled to a pair of channel EHE signal generators (i.e., left and right channel EHE signal generators 206, 208). The channel EHE signal generators 206, 208 utilize the harmonic frequencies from the frequency converters 204 to generate respective channel EHE signals $x_L(\text{rpm}, t)$, $x_R(\text{rpm}, t)$.

Each of the channel EHE signal generators 206, 208 includes a plurality of EHE signal generators. The left channel EHE signal generator 206 includes EHE signal generators 210-1-210-n (referenced collectively as "210"), one for each harmonic. Similarly, the right channel EHE signal generator includes EHE signal generators 212-1-212-n (referenced collectively as "212"), one for each harmonic.

As shown in FIG. 2B, each of the EHE signal generators 210 of the left channel signal generator 206 includes a phase determiner 214-1-214-n (referenced collectively as "214"), a reference signal generator 216-1-216-n (referenced collectively as "216"), a harmonic shape determiner 218-1-218-n (referenced collectively as "218"), and a harmonic gain element 220-1-220-n (referenced collectively as "220"). Similarly, as shown in FIG. 2C, each of the EHE signal generators 212 of the right channel signal generator 208 includes a phase determiner 222-1-222-n (referenced collectively as "222"), a reference signal generator 224-1-224-n (referenced collectively as "224"), a harmonic shape determiner 226-1-226-n (referenced collectively as "226"), and a harmonic gain element 228-1-228-n (referenced collectively as "228"). The phase determiners 214, 222, the reference signal generators 216, 224, and the harmonic shape determiners 218, 226 are each operationally coupled to a corresponding one of the frequency converters 204.

The phase determiners 214, 222 determine the phase of the corresponding engine harmonic enhancement signal. The individual phase determiners 214, 222 may be implemented as frequency-to-phase look-up tables (LUTs) which enables the phase of each harmonic to be frequency dependent. Alternatively, the phase may be calculated or approximated according to a formula f(rpm). Notably, a phase difference, $\Delta\phi_k$, between the left and right phase values (see equation 6, above) is introduced per harmonic. This tunable phase difference can be beneficial for controlling a width (left-to-right) of the perceived sound stage as the left and right channel EHE signals are transduced via respective speakers. This width can be adjusted independently per RPM regions by tuning the left and right phase values.

In operation, each of the phase determiners 214, 222 receives input from a corresponding one of the frequency converters 204. Based on the input from the corresponding frequency converter 204, each of the phase determiners 214, 222 determines a phase of a reference signal that is generated by a corresponding one of the reference signal generators 216, 224.

The reference signal generators 216, 224 each generate a reference signal in the form of a sinusoid having a frequency component related to the harmonic frequency from the corresponding one of the frequency converters 204, and a phase component related to the phase provided from the corresponding one of the phase determiners 214, 222. The harmonic gain elements 220, 228 are each operationally coupled to a corresponding one of the reference signal generators 216, 224 for applying a harmonic specific gain to a corresponding one of the reference signals to provide the engine harmonic enhancement (EHE) signals, $h_{Lk}$, $h_{Rk}$.

$$h_{Lk}(t)=c_{Lk}(\text{rpm}(t))\cdot\sin(\omega_k(\text{rpm}(t))\cdot t+\phi_{Lk}(\text{rpm}(t))) \quad (7)$$

$$h_{Rk}(t)=c_{Rk}(\text{rpm}(t))\cdot\sin(\omega_k(\text{rpm}(t))\cdot t+\phi_{Rk}(\text{rpm}(t))) \quad (8)$$

The individual harmonic shape determiners 218, 226 may determine or approximate the gain by calculation according to a formula or may retrieve the gain from a frequency-to-gain look-up table (LUT). In operation, each of the harmonic shape determiners 218, 226 receives input from a corresponding one of the frequency converters 204. Based on the input, each of the shape determiners 218, 226 determines a gain to be applied by a corresponding one of the gain elements 220, 228, which enables the magnitude of each engine harmonic enhancement signal to be frequency dependent.

The harmonic gain elements 220 of the left engine harmonic enhancement channel signal generator 206 are operationally coupled to a first harmonics summer 230, and the harmonic gain elements 228 of the right channel EHE signal generator 208 are operationally coupled to a second summer 232. The first harmonics summer 230 combines the EHE signals, $h_{Lk}(t)$, from the harmonic gain elements 220 of the left channel EHE signal determiner 206 to provide the left channel EHE signal, $x_L(\text{rpm}, t)$. Similarly, the second harmonics summer 232 combines the EHE signals, $h_{Rk}(t)$, from the harmonic gain elements 228 of the right channel EHE signal determiner 208 to provide the right channel EHE signal $x_R(\text{rpm}, t)$.

The left channel EHE signal can be distributed to one or more loudspeakers on the left side of the vehicle cabin 114 (FIG. 1) for transduction to acoustic energy, and the right channel EHE signal can be distributed to one or more loudspeakers in the right side of the vehicle cabin 114 for transduction to acoustic energy.

In some cases, a sound stage processor 234 may be provided for processing the left and right channel EHE signals to determine an acoustic image of for each of the channel EHE signals. The sound stage processor 234 may include a plurality of equalizers (EQs), one for each speaker. Generally, the equalized left channel EHE signal is distributed to one or more loudspeakers on the left side of the vehicle cabin 114 (FIG. 1), and the equalized right channel EHE signal is distributed to one or more loudspeakers on the right side of the vehicle cabin 114 (FIG. 1).

Figure 3A:
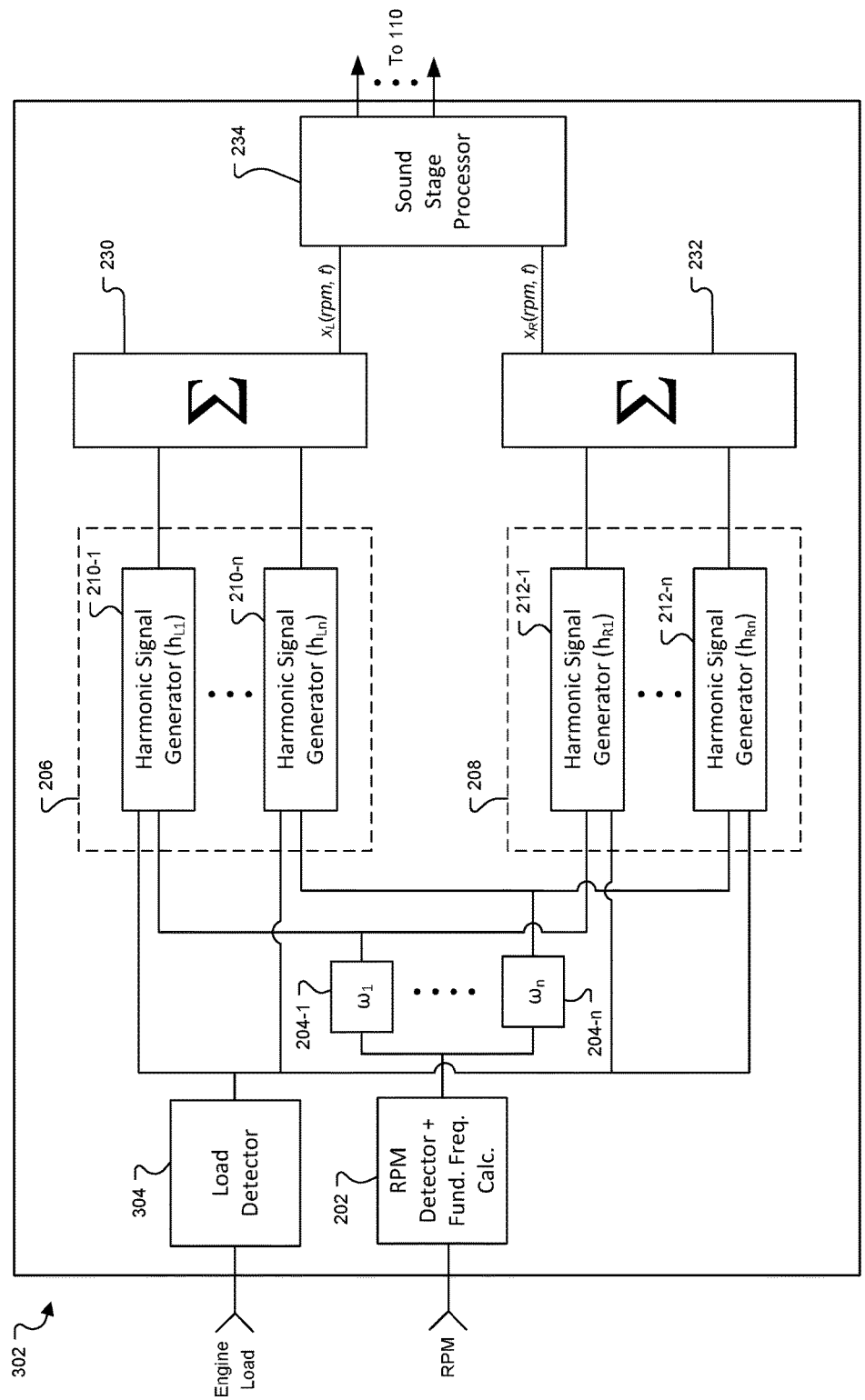
FIG. 3A is a block diagram of an alternative EHE processor that utilizes engine load to adjust harmonic specific phases.

In some instances, the sound stage can also be controlled in width by using the engine load as a control input to adjust the phase difference between left and right channel. In this case: $\Delta\phi_k$=f(rpm, load). FIG. 3A is a block diagram of an EHE processor 302 that utilizes engine load to adjust the harmonic specific phases, like reference numbers represent like elements.

The EHE processor 302 includes an engine load detector 304. The engine load detector 304 determines the inherent engine sound level to properly balance the sound enhancement. A vehicle's Engine Control Unit (ECU) 114 (FIG. 1) will typically have available several of the following signals which correlate well with the engine load and may be available to the EHE system either in analog or digital form, for example, accelerator pedal position (APP); throttle position sensor (TPS); mass air flow (MAF); manifold absolute pressure (MAP); engine torque; and/or computed engine load. Any one of these signals is suitable for EHE control.

The engine load detector 304 may convert the engine load signal from a native data form to a form more useful to the EHE system. For example, if the engine load signal is representative of the engine torque, the engine load detector may convert the torque measurement to an engine load measurement. The engine load may be expressed as an index; for example, the maximum engine load may be designated as 100 and the engine load may be expressed as number from 1-100.

The engine load detector 304 provides input to the phase determiners 214, 222 (FIGS. 3B and 3C, respectively) which can then determine the harmonic specific phase as a function of both the RPM and the engine load. The individual phase determiners 214, 222 may be implemented as multivariable look-up tables (LUTs) which enables the phase of each harmonic to be frequency and load dependent. Alternatively, the phase may be calculated or approximated according to a formula f(RPM, load).

Figure 3B:
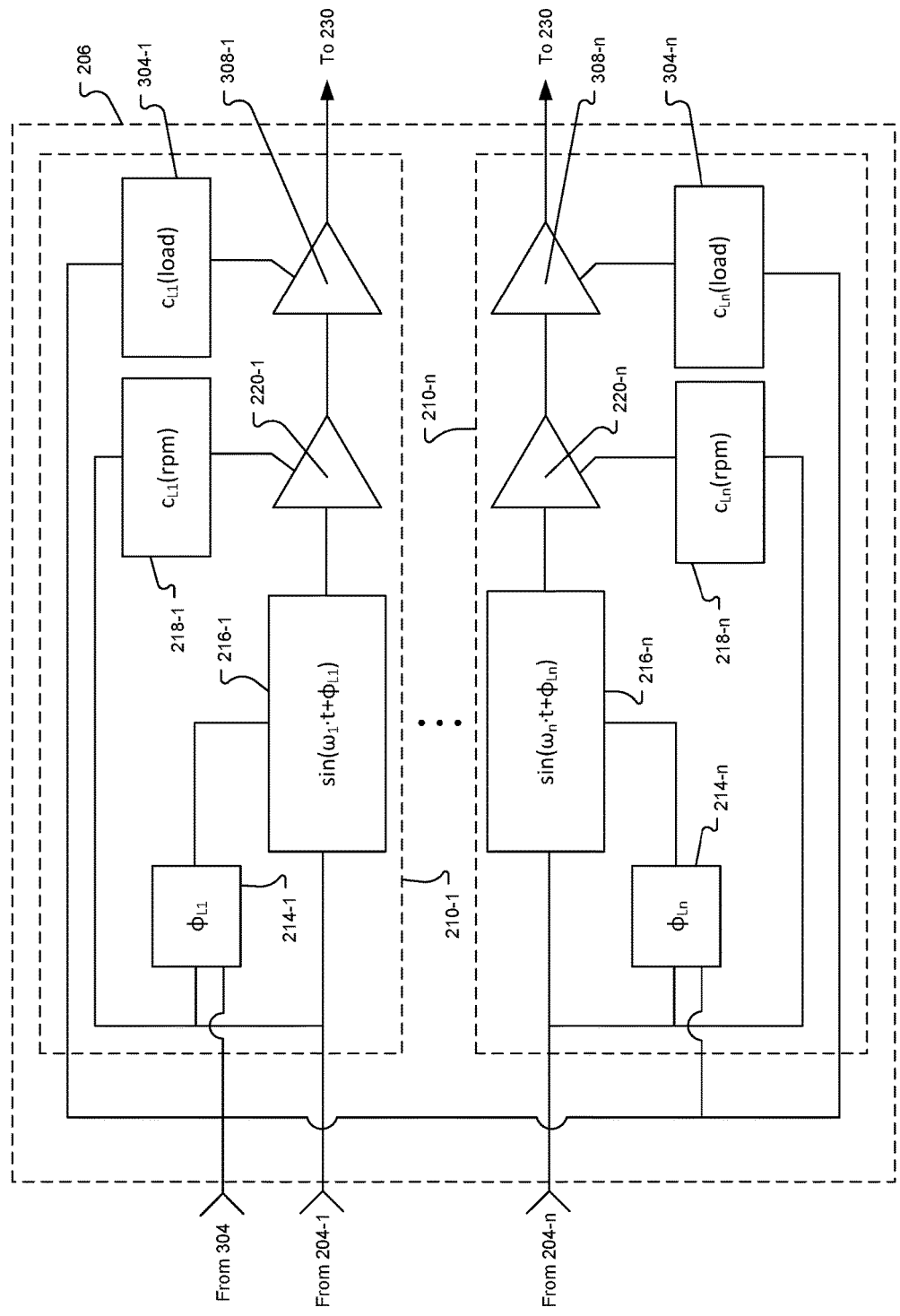
FIG. 3B is a block diagram of a left channel EHE signal generator from the EHE processor of FIG. 3A.
Figure 3C:
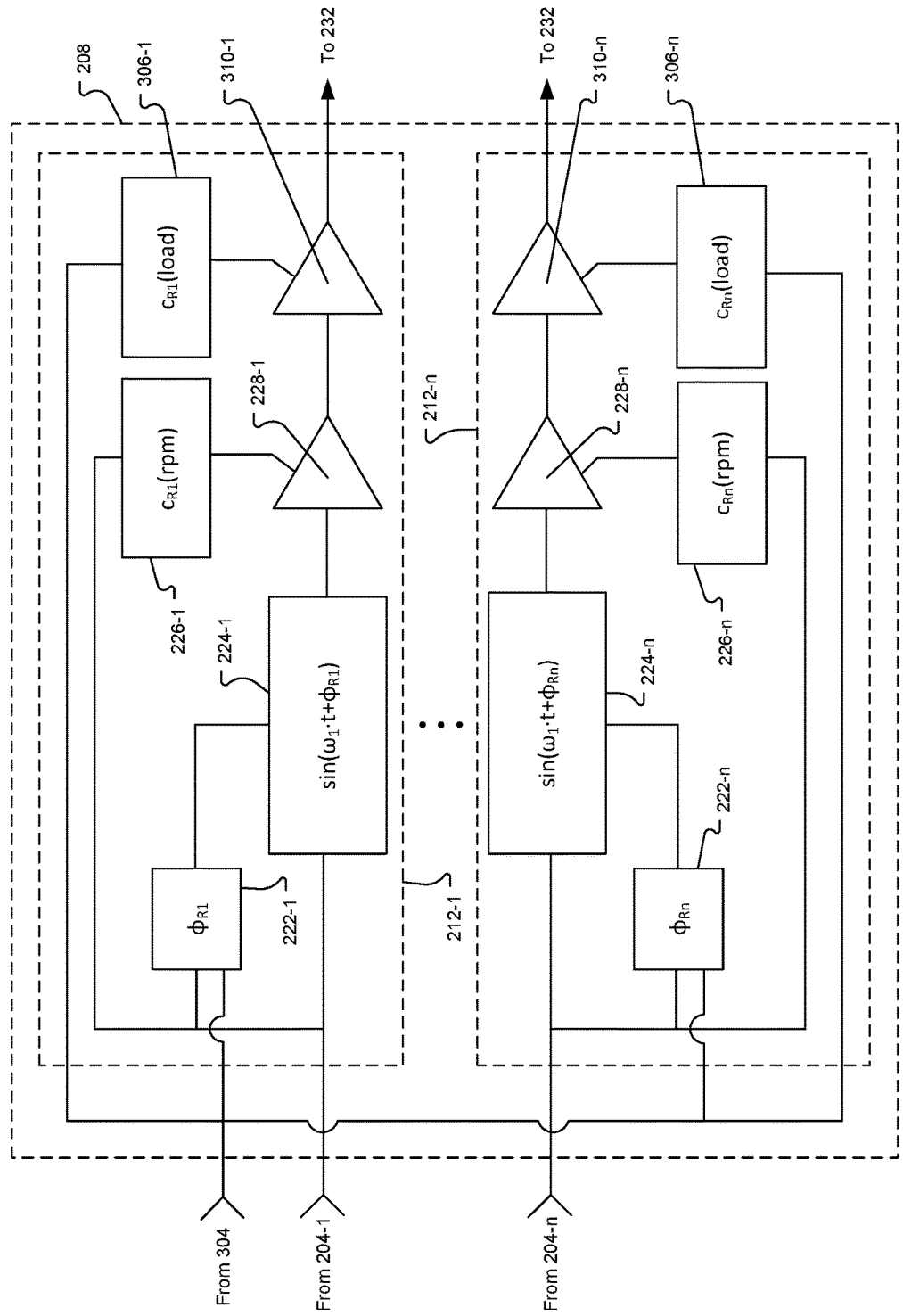
FIG. 3C is a block diagram of a right channel EHE signal generator from the EHE processor of FIG. 3A.

Alternatively or additionally, the magnitude of the engine harmonic enhancement signals may be dependent on load. In that regard, the engine harmonic enhancement (EHE) signal generators 210, 212 may also include EHE gain determiners 304-1-304-$n$ (left), 306-1-306-$n$ (right) and associated gain elements 308-1-308-$n$ (left), 310-1-310-$n$ (right) for applying a load dependent gain to the output of the harmonic gain elements 220, 228, as shown in FIGS. 3B and 3C. The resulting magnitude is the product of the frequency dependent gain and the load dependent gain, and the left and right channel EHE signals take the form:

$$x_L(\text{rpm,load},t)=\Sigma_{k=1}^{N}c_{Lk}(\text{rpm,load})\cdot\sin(\omega_k(\text{rpm})\cdot t+\phi_{Lk}(\text{rpm,load})) \quad (9)$$

$$x_R(\text{rpm,load},t)=\Sigma_{k=1}^{N}c_{Rk}(\text{rpm,load})\cdot\sin(\omega_k(\text{rpm})\cdot t+\phi_{Rk}(\text{rpm,load})) \quad (10)$$

Creating a Front-Rear Controllable Sound Stage

To create a front-rear controllable sound stage, a signal (i.e., a front channel EHE signal) for the front loudspeakers and another signal (i.e., a rear (hind) channel EHE signal) to be played via the rear loudspeakers are provided.

The front channel EHE signal is:

$$x_F(\text{rpm},t) = \sum_{k=1}^{N} c_{Fk}(\text{rpm}) \cdot \sin(\omega_k(\text{rpm}) \cdot t + \phi_{Fk}(\text{rpm})) \quad (11)$$

And the hind (rear) channel EHE signal is:

$$x_H(\text{rpm},t) = \sum_{k=1}^{N} c_{Hk}(\text{rpm}) \cdot \sin(\omega_k(\text{rpm}) \cdot t + \phi_{Hk}(\text{rpm})) \quad (12)$$

Where the phases of the front and hind signals are related by:

$$\Delta\phi_{FHk}(\text{rpm}) = \phi_{Fk}(\text{rpm}) - \phi_{Hk}(\text{rpm}) \quad (13)$$

And the magnitudes in dB by:

$$\Delta c_{FHk}(\text{rpm}) = c_{Fk}(\text{rpm}) - c_{Hk}(\text{rpm}) \quad (14)$$

A difference of about 3 dB in level between the front and the rear signal will correspond to a perceivable shift of the sound stage to the front or rear direction. The louder signal will pull the sound stage towards that direction.

Figure 4A:
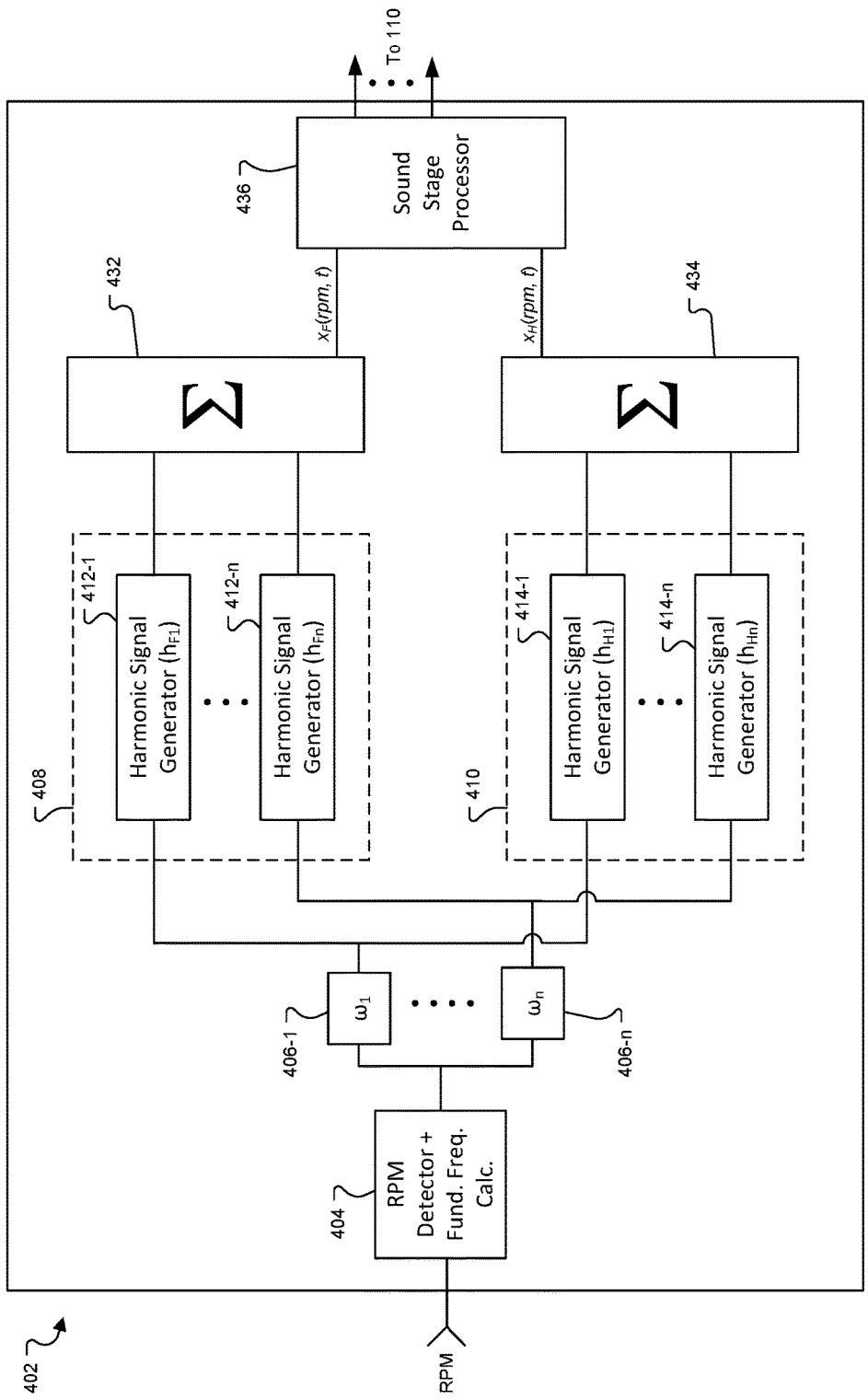
FIG. 4A is a block diagram of an alternative EHE processor that utilizes engine load to adjust harmonic specific phases and magnitudes.
Figure 4B:
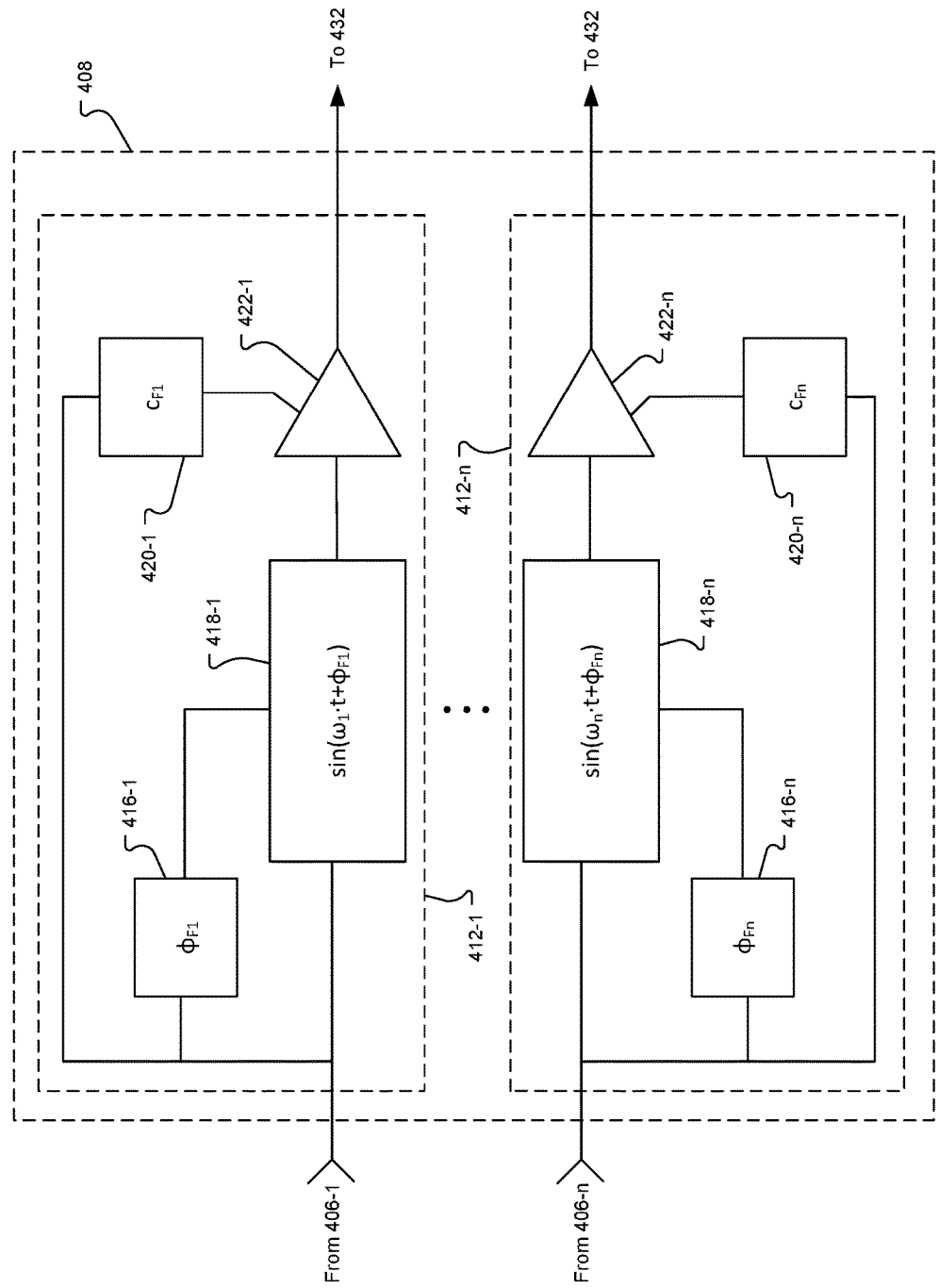
FIG. 4B is a block diagram of a front channel EHE signal generator from the EHE processor of FIG. 4A.
Figure 4C:
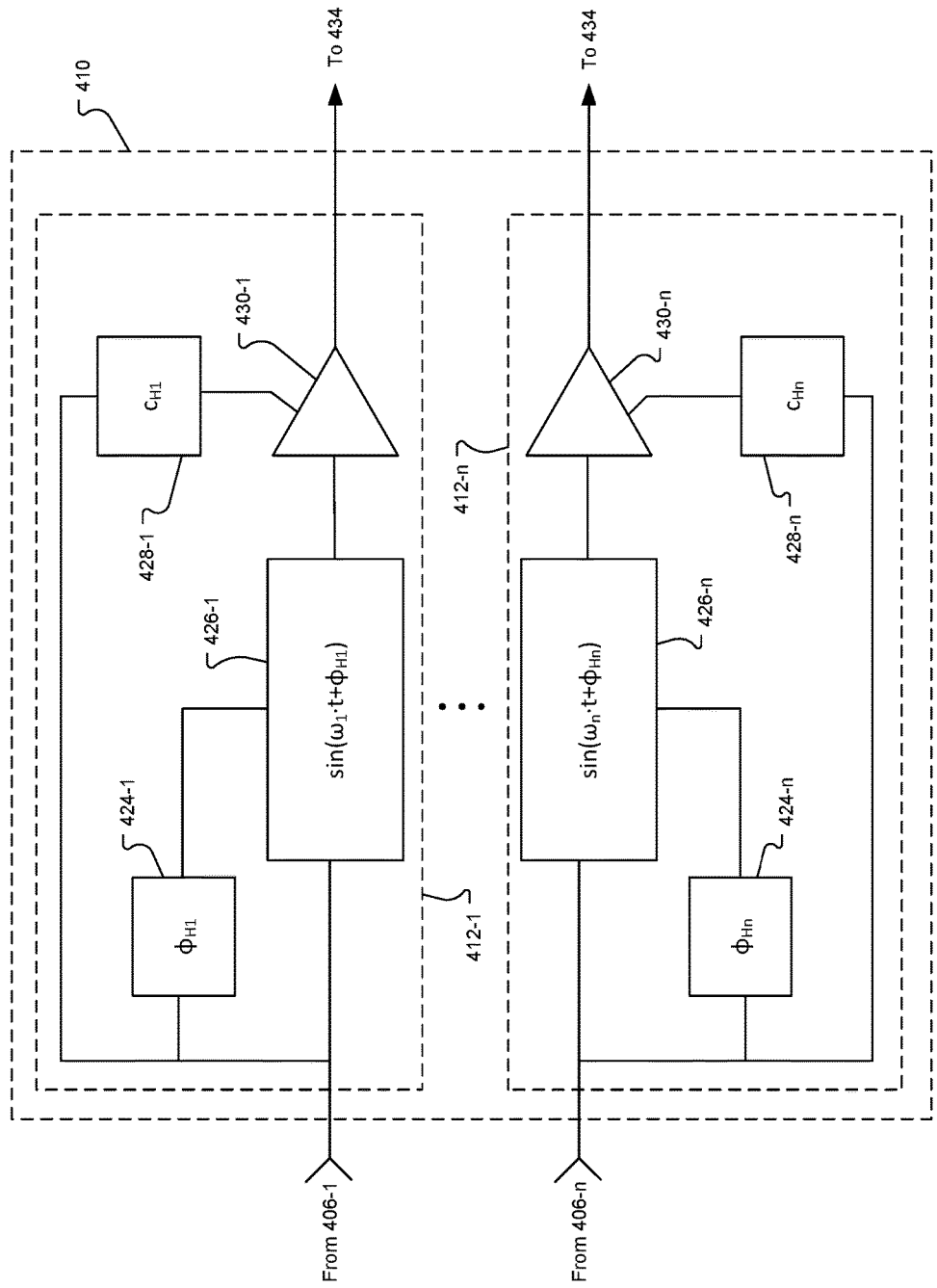
FIG. 4C is a block diagram of a rear channel EHE signal generator from the EHE processor of FIG. 4A.

FIGS. 4A through 4C illustrate an alternative EHE processor 402 that can be used with the system of FIG. 1 to create a sound stage that shifts between the front and rear of the vehicle cabin with changes in RPM. An RPM detector and fundamental frequency calculator 404 receives as input a signal indicative of the engine speed in RPM. The RPM detector and fundamental frequency calculator 404 is operationally coupled to a plurality of frequency converters 406-1-406-n (referenced collectively as "406") which generate respective harmonic signals each of which is a multiple of the fundamental frequency.

The RPM detector and fundamental harmonic frequency calculator 404 determines the fundamental engine rotation frequency and provides that as input to the frequency converters 406. The frequency converters 406 compute the frequency for each enhanced harmonic by multiplying the fundamental engine rotation frequency by the order of each enhanced engine harmonic. The frequency converters 406 are operationally coupled to a pair of channel EHE signal generators (i.e., front and rear (hind) channel EHE signal generators 408, 410). The channel EHE signal generators utilize the harmonic frequencies from the frequency converters 406 to generate respective channel EHE signals $x_F(\text{rpm}, t)$, $x_H(\text{rpm}, t)$.

Each of the channel EHE signal generators 408, 410 includes a plurality of EHE signal generators. As shown in FIG. 4B, the front channel EHE signal generator 408 includes front EHE signal generators 412-1-412-n (referenced collectively as "412"), one for each harmonic. Similarly, as shown in FIG. 4C, the rear channel EHE signal generator includes rear (hind) EHE signal generators 414-1-414-n (referenced collectively as "414"), one for each harmonic.

Each of the EHE signal generators 412 of the front channel EHE signal generator 408 includes a phase determiner 416-1-416-n (referenced collectively as "416"), a reference signal generator 418-1-418-n (referenced collectively as "418"), a harmonic shape determiner 420-1-420-n (referenced collectively as "420"), and a harmonic gain element 422-1-422-n (referenced collectively as "422"). Similarly, each of the EHE signal generators 414 of the right channel signal generator 208 includes a phase determiner 424-1-424-n (referenced collectively as "424"), a reference signal generator 42-1-426-n (referenced collectively as "426"), a harmonic shape determiner 428-1-428-n (refer-enced collectively as "428"), and a harmonic gain element 430-1-430-n (referenced collectively as "430"). The phase determiners 416, 424, the reference signal generators 418, 426, and the harmonic shape determiners 420, 428 are each operationally coupled to a corresponding one of the frequency converters 406.

The phase determiners 416, 424 determine the phase of the corresponding engine harmonic enhancement signal. The individual phase determiners 416, 424 may be implemented as frequency-to-phase look-up tables (LUTs) which enables the phase of each harmonic to be frequency dependent. Alternatively, the phase may be calculated or approximated according to a formula f(RPM). The phase difference can provide panning or latency between front and hind and add to the staging perception.

In operation, each of the phase determiners 416, 424 receives input from a corresponding one of the frequency converters 406. Based on the input from the corresponding frequency converter 406, each of the phase determiners 416, 424 determines a phase of a reference signal that is generated by a corresponding one of the reference signal generators 418, 426.

The reference signal generators 418, 426 each generate a reference signal in the form of a sinusoid having a frequency component related to the harmonic frequency from the corresponding one of the frequency converters, and a phase component related to the phase provided from the corresponding one of the phase determiners 418, 426. The gain elements 422, 430 are each operationally coupled to a corresponding one of the reference signal generators 418, 426 for applying a harmonic specific gain to a corresponding one of the reference signals to provide the engine harmonic enhancement signals.

The individual harmonic shape determiners 420, 428 may determine or approximate the gain by calculation according to a formula or may retrieve the gain from a frequency-to-gain look-up table (LUT). In operation, each of the harmonic shape determiners 420, 428 receives input from a corresponding one of the frequency converters 406. Based on the input, each of the shape determiners 420, 428 determines a gain to be applied by a corresponding one of the gain elements 422, 430, which enables the magnitude of each engine harmonic enhancement signal to be frequency dependent.

The harmonic gain elements 422 of the front engine harmonic enhancement channel signal determiner 408 are operationally coupled to a first harmonics summer 432, and the harmonic gain elements 430 of the rear (hind) channel EHE signal determiner 410 are operationally coupled to a second summer 434. The first harmonics summer 432 combines the EHE signals from the harmonic gain elements 422 of the front channel EHE signal generator 408 to provide the front channel EHE signal, $x_F(\text{rpm}, t)$. Similarly, the second harmonics summer 434 combines the EHE signals from the harmonic gain elements 430 of the rear channel EHE signal generator 410 to provide the rear channel EHE signal $x_H(\text{rpm}, t)$.

Notably, a gain difference, $\Delta c_{FHk}$, between the front and rear gain values is introduced per harmonic. This tunable gain difference can be beneficial for controlling a front-to-back location of the perceived sound stage as the front and rear channel EHE signals are transduced via respective speakers. A difference of about 3 dB in level between the front and the rear channel EHE signals will correspond to a perceivable shift of the sound stage to the front or rear direction. The louder signal will pull the sound stage towards that direction.

The front channel EHE signal, $x_F$(rpm, t) can be distributed to one or more loudspeakers in the front of the vehicle cabin 114 for transduction to acoustic energy, and the rear channel EHE signal, $x_H$(rpm, t), can be distributed to one or more loudspeakers in the rear of the vehicle cabin 114 for transduction to acoustic energy.

In some cases, a sound stage processor 436 may be provided for processing the front and rear channel EHE signals to determine an acoustic image of for each of the channel EHE signals. The sound stage processor 436 may include a plurality of equalizers (EQs), one for each speaker. Generally, the equalized front channel EHE signal is distributed to one or more loudspeakers on the front of the vehicle cabin 114 (FIG. 1) according to the equalization, and the equalized rear channel EHE signal is distributed to one or more loudspeakers on the rear of the vehicle cabin 114 (FIG. 1) according to the equalization.

Figure 5A:
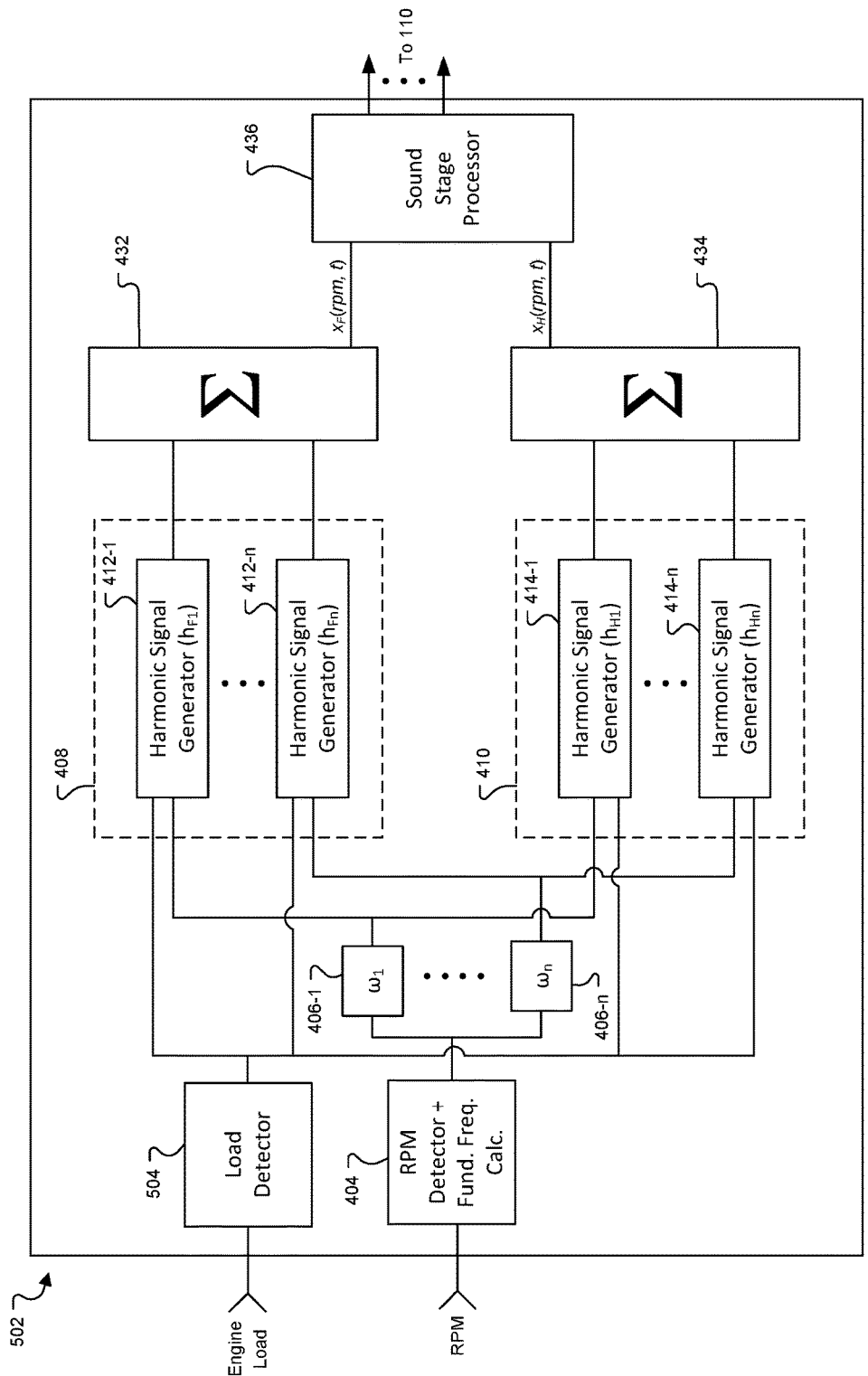
FIG. 5A is a block diagram of an alternative EHE processor that utilizes engine load to adjust harmonic specific phases and magnitudes.
Figure 5B:
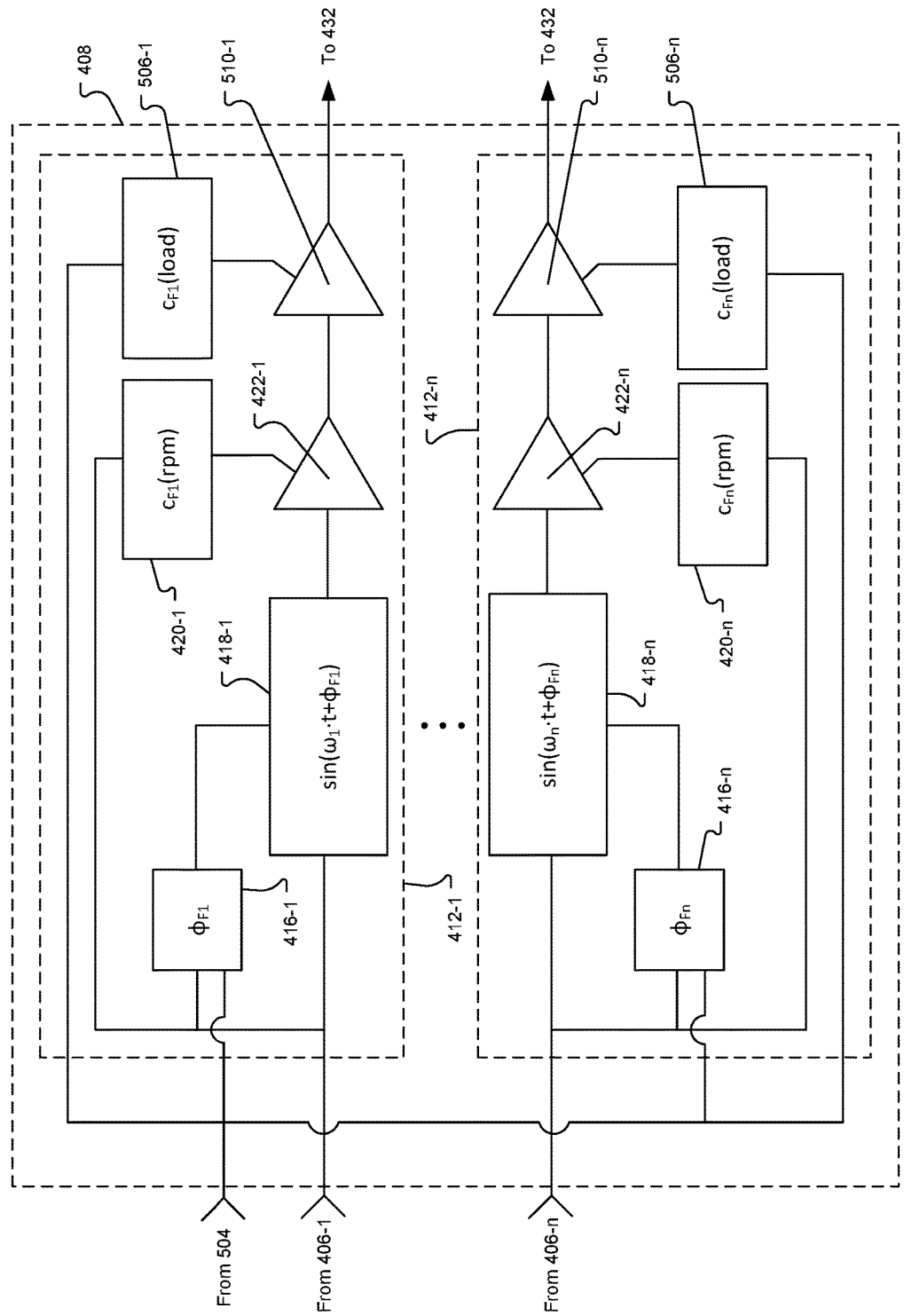
FIG. 5B is a block diagram of a front channel EHE signal generator from the EHE processor of FIG. 5A.
Figure 5C:
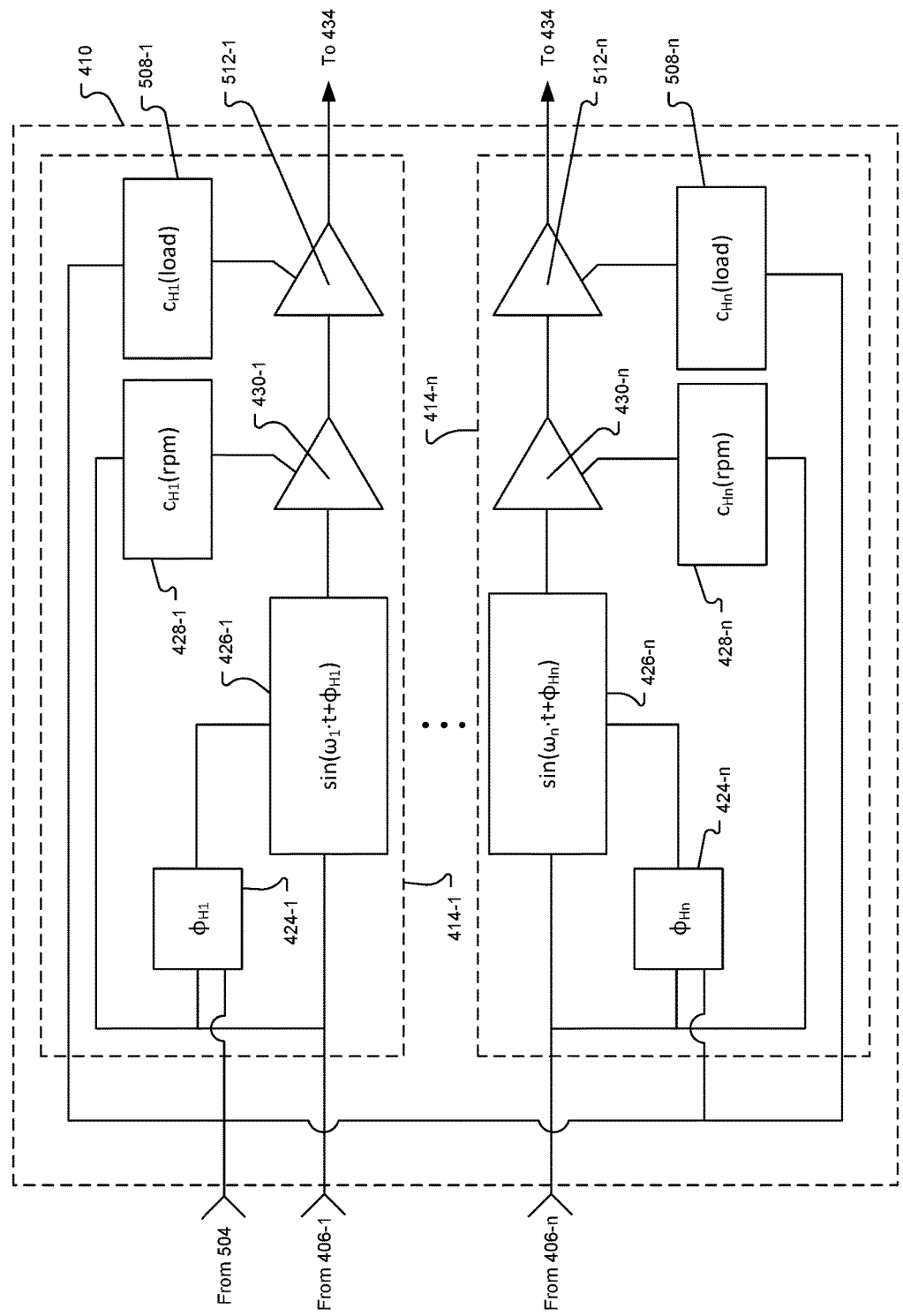
FIG. 5C is a block diagram of a rear channel EHE signal generator from the EHE processor of FIG. 5A.

FIGS. 5A through 5C illustrate an alternative EHE processor 502 that can be used to create a sound stage that shifts between the front and rear of the vehicle cabin with changes in RPM and which utilizes engine load to adjust the harmonic specific phases and magnitudes. Like reference numbers represent like components.

The EHE processor 502 includes an engine load detector 504. The engine load detector 504 provides input to the phase determiners 416, 424 (FIGS. 5B and 5C, respectively) which can then determine the harmonic specific phase as a function of both the RPM and the engine load. The individual phase determiners 416, 424 may be implemented as multivariable look-up tables (LUTs) which enables the phase of each harmonic to be frequency and load dependent. Alternatively, the phase may be calculated or approximated according to a formula f(RPM, load).

Alternatively or additionally, the magnitude of the engine harmonic enhancement signals may be dependent on load. In that regard, the engine harmonic enhancement (EHE) signal generators 412, 414 may also include EHE gain determiners 506-1-506-$n$ (front), 508-1-508-$n$ (rear/hind) and associated gain elements 510-1-510-$n$ (front), 512-1-512-$n$ (rear/hind) for applying a load dependent gain to the output of the harmonic gain elements 422, 430, as shown in FIGS. 3B and 3C. The resulting magnitude is the product of the frequency dependent gain and the load dependent gain, and the left and right channel EHE signals take the form:

$$x_F(\text{rpm,load},t)=\Sigma_{k=1}^{N}c_{Fk}(\text{rpm,load})\cdot\sin(\omega_k(\text{rpm})\cdot t+\phi_{Fk}(\text{rpm,load})) \quad (13)$$

$$x_H(\text{rpm,load},t)=\Sigma_{k=1}^{N}c_{Hk}(\text{rpm,load})\cdot\sin(\omega_k(\text{rpm})\cdot t+\phi_{Hk}(\text{rpm,load})) \quad (14)$$

A number of implementations have been described. Nevertheless, it will be understood that additional modifications may be made without departing from the scope of the inventive concepts described herein, and, accordingly, other implementations are within the scope of the following claims.

What is claimed is:

1. A method comprising:
   generating a left channel harmonic enhancement signal comprising a first plurality of engine harmonic enhancement signal components;
   generating a right channel harmonic enhancement signal comprising a second plurality of engine harmonic enhancement signal components; and
   controlling a width of a sound stage in a vehicle cabin by introducing, on a per harmonic basis, one or more differences between the left channel harmonic enhancement signal and the right channel harmonic enhancement signal, wherein the one or more differences includes a phase difference between the left channel harmonic enhancement signal and the right channel harmonic enhancement signal.

2. The method of claim 1, wherein the per harmonic phase difference varies as a function of engine RPM.

3. The method of claim 1, wherein the per harmonic phase difference varies as a function of engine load.

4. The method of claim 1, further comprising:
   distributing the left channel harmonic enhancement signal to one or more speakers positioned near a left side of the vehicle cabin; and
   distributing the right channel harmonic enhancement signal to one or more speakers positioned near a right side of the vehicle cabin.

5. A method comprising:
   generating a front channel harmonic enhancement signal comprising a first plurality of engine harmonic enhancement signal components;
   generating a rear channel harmonic enhancement signal comprising a second plurality of engine harmonic enhancement signal components; and
   controlling a front-rear depth of a sound stage in a vehicle cabin by introducing, on a per harmonic basis, one or more differences between the front channel harmonic enhancement signal and the rear channel harmonic enhancement signal, wherein the one or more differences include a gain difference between the front channel harmonic enhancement signal and the rear channel harmonic enhancement signal.

6. The method of claim 5, wherein the per harmonic gain difference varies as a function of engine RPM.

7. The method of claim 5, wherein the per harmonic gain difference varies as a function of engine load.

8. The method of claim 5, further comprising:
   distributing the front channel harmonic enhancement signal to one or more speakers positioned near a front portion of the vehicle cabin; and
   distributing the rear channel harmonic enhancement signal to one or more speakers positioned near a rear portion of the vehicle cabin.

9. A vehicle engine sound enhancement system comprising:
   circuitry for generating a left channel harmonic enhancement signal comprising a first plurality of engine harmonic enhancement signal components;
   circuitry for generating a right channel harmonic enhancement signal comprising a second plurality of engine harmonic enhancement signal components; and
   circuitry for controlling a width of a sound stage in a vehicle cabin by introducing, on a per harmonic basis, one or more differences between the left channel harmonic enhancement signal and the right channel harmonic enhancement signal, wherein the one or more differences includes a phase difference between the left channel harmonic enhancement signal and the right channel harmonic enhancement signal.

10. The system of claim 9, wherein the per harmonic phase difference varies as a function of engine RPM, engine load, or both.

11. The system of claim 9, further comprising:
    circuitry for distributing the left channel harmonic enhancement signal to one or more speakers positioned near a left side of the vehicle cabin; and circuitry for distributing the right channel harmonic enhancement signal to one or more speakers positioned near a right side of the vehicle cabin.

12. A vehicle engine sound enhancement system comprising:
   circuitry for generating a front channel harmonic enhancement signal comprising a first plurality of engine harmonic enhancement signal components;
   circuitry for generating a rear channel harmonic enhancement signal comprising a second plurality of engine harmonic enhancement signal components; and
   circuitry for controlling a front-rear depth of a sound stage in a vehicle cabin by introducing, on a per harmonic basis, one or more differences between the front channel harmonic enhancement signal and the rear channel harmonic enhancement signal, wherein the one or more differences include a gain difference between the front channel signal and the rear channel signal.

13. The system of claim 12, wherein the per harmonic gain difference varies as a function of engine RPM, engine load, or both.

14. The system of claim 12, further comprising:
   circuitry for distributing the front channel harmonic enhancement signal to one or more speakers positioned near a front portion of the vehicle cabin; and
   circuitry for distributing the rear channel harmonic enhancement signal to one or more speakers positioned near a rear portion of the vehicle cabin.

* * * * *